United States Patent
Cho et al.

(10) Patent No.: US 7,795,054 B2
(45) Date of Patent: Sep. 14, 2010

(54) VERTICAL STRUCTURE LED DEVICE AND METHOD OF MANUFACTURING THE SAME

(75) Inventors: Myong Soo Cho, Gyunggi-do (KR); Ki Yeol Park, Daegu (KR); Sang Yeob Song, Gyunggi-do (KR); Si Hyuk Lee, Gyunggi-do (KR); Pun Jae Choi, Gyunggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 455 days.

(21) Appl. No.: 11/987,712

(22) Filed: Dec. 4, 2007

(65) Prior Publication Data
US 2008/0135859 A1 Jun. 12, 2008

(30) Foreign Application Priority Data
Dec. 8, 2006 (KR) .................. 10-2006-0125015
Sep. 21, 2007 (KR) .................. 10-2007-0097025

(51) Int. Cl.
*H01L 21/00* (2006.01)
*H01L 21/50* (2006.01)
*H01L 21/48* (2006.01)
*H01L 21/44* (2006.01)

(52) U.S. Cl. ............. 438/29; 438/22; 438/46; 438/82; 438/118; 438/653; 257/E21.09; 257/E21.72; 257/E21.476; 257/E21.567

(58) Field of Classification Search ........... 257/E21.09, 257/E21.172, E21.476, E21.567
See application file for complete search history.

(56) References Cited

U.S. PATENT DOCUMENTS

| 5,804,801 | A | 9/1998 | Lauf et al. |
| 2004/0072383 | A1 | 4/2004 | Nagahama et al. |
| 2006/0255348 | A1* | 11/2006 | Liu et al. .................. 257/91 |
| 2008/0315176 | A1* | 12/2008 | Takeuchi et al. ........... 257/13 |

FOREIGN PATENT DOCUMENTS

JP          2004-266240         9/2004

* cited by examiner

*Primary Examiner*—Charles D Garber
*Assistant Examiner*—Mohsen Ahmadi
(74) *Attorney, Agent, or Firm*—McDermott Will & Emery LLP

(57) ABSTRACT

A method of manufacturing a vertical structure light emitting diode device, the method including: sequentially forming a first conductivity type III-V group compound semiconductor layer, an active layer, and a second conductivity type III-V group compound semiconductor layer on a substrate for growth; bonding a conductive substrate to the second conductivity type III-V group compound semiconductor layer; removing the substrate for growth from the first conductivity type III-V group compound semiconductor layer; and forming an electrode on an exposed portion of the first conductive III-V group compound semiconductor layer due to the removing the substrate for growth, wherein the bonding a conductive substrate comprises partially heating a metal bonding layer by applying microwaves to a bonding interface while bringing the metal bonding layer into contact with the bonding interface.

20 Claims, 13 Drawing Sheets

VERTICAL STRUCTURE LED DEVICE AND METHOD OF MANUFACTURING THE SAME

CROSS-REFERENCE TO RELATED APPLICATIONS

This application claims the priorities of Korean Patent Application Nos. 2006-0125015 and 2007-97025 filed on Dec. 8, 2006 and Sep. 21, 2007 respectively, in the Korean Intellectual Property Office, the disclosure of which is incorporated herein by reference.

BACKGROUND OF THE INVENTION

1. Field of the Invention

The present invention relates to a vertical structure III-V group compound semiconductor light emitting diode (LED) device and a method of manufacturing the same, and more particularly, to a vertical structure semiconductor LED device capable of enabling wafer bonding at a low temperature and preventing occurrence of stress and a method of manufacturing the same.

2. Description of the Related Art

In general, III-V group GaN semiconductors shown as $Al_xGa_yIn_{(1-x-y)}N$ ($0 \leq x \leq 1$, $0 \leq y \leq 1$, and $0 \leq x+y \leq 1$) are compound semiconductor materials suitable for emitting light in ranges of blue and ultraviolet and used for light emitting diode (LED) devices of ultraviolet and blue. General GaN LEDs include an n-type GaN semiconductor layer, an active layer, and a p-type GaN semiconductor layer, and two electrodes including an n-side electrode and p-side electrode. Since a sapphire substrate used for a substrate for growth is an insulating material, to apply current to the active layer, a portion of the GaN semiconductor is etched and the n-side electrode is formed on an exposed portion of the n-type semiconductor layer. In the horizontal structure GaN LED device, since all of the two electrodes are disposed above the device, there are disadvantages in aspects of current diffusion and electrostatic.

Instead of the horizontal structure GaN LED devices having such disadvantages, recently, vertical structure GaN LEDs using a conductive SiC substrate for a substrate for growing a GaN semiconductor have been used. However, in this case, it is required to use a high priced SiC substrate. Vertical structure GaN LEDs in another form are manufactured by a process of bonding a conductive substrate (wafer bonding) and a process of separating or removing a sapphire substrate. For example, Korean Patent Publication No. 10-2004-0058479 discloses a vertical structure GaN LED including a conductive substrate such as an Si substrate bonded to a GaN semiconductor layer by a conductive bonding layer.

FIG. 1 is a cross-sectional view illustrating a conventional vertical structure GaN LED device. Referring to FIG. 1, a vertical structure GaN LED device 10 includes an n-side electrode 17, an n-type GaN semiconductor layer 16 formed below the n-side electrode 17, an active layer 15, a p-type GaN semiconductor layer 14, and a reflective metal layer 13. Also, below the reflective metal layer 13, a conductive substrate 11 is bonded by a conductive bonding layer 12 and a p-side bonding electrode 18 is formed at the bottom of the conductive substrate 11. The conductive bonding layer 12 may be formed of a eutectic metal having a low melting point such as AuSn, and the conductive substrate 11 may be formed of an Si substrate having an excellent thermal conductivity. The vertical structure GaN LED device 10 shows more improved light emitting efficiency, heating characteristics, and electrostatic discharge immunity that those of a horizontal structure GaN LED device and has a light emitting area larger than that of the horizontal structure LED device in the same chip area.

FIGS. 2A through 2D are cross-sectional views illustrating a method of manufacturing the vertical structure GaN LED device 10. Referring to FIG. 2A, on a sapphire substrate 21, which is a substrate for growth, GaN semiconductor layers 13, 14, and 15 and a reflective metal layer 13 are formed. Referring to FIG. 2B, a conductive substrate 11 is bonded to a GaN semiconductor layer side (wafer bonding process) by using a conductive bonding layer 12 having a low melting point of 330° C. or less. Referring to FIG. 2C, the sapphire substrate 21 is separated or removed by one method of laser lift off and chemical mechanical planarization. After separating the sapphire substrate 21, referring to FIG. 2D, electrodes 17 and 18 are formed on an n-type semiconductor layer 16 exposed by the separation of the substrate 21 and a conductive substrate 11.

According to the conventional manufacturing process, in a wafer bonding process, substrate bonding is performed under a uniaxial pressure by the medium of eutectic metals having a relatively low melting point of 330° C. or less, such as AuSn, AuIn, PdIn, Sn, and In. Since a high atmosphere temperature of 450° C. or more and a high pressure of 0.4 kgf/cm² are required when directly bonding a conductive substrate by using a metal having a high melting point, such as Au, the metal having a low melting point is used. In a condition of such the high temperature and high pressure, due to a difference between thermal expansion coefficients of the sapphire substrate and conductive substrate, a great stress is applied to a substrate, thereby bending the substrate or generating a lot of defects and cracks in the GaN semiconductor layer. Particularly, in a laser lift off process after wafer bonding, a bonding structure itself is destroyed, thereby greatly reducing a process yield.

However, in the case of the wafer bonding using an eutectic metal having a low melting point as a bonding material, there is still a stress generated due to a difference between thermal expansion coefficients of a substrate for growth and a conductive substrate at a temperature from 200 to 330° C. Also, a thermal processing temperature to improve ohmic characteristics of the n-side electrode layer formed on the n-type semiconductor layer exposed after removing the substrate for growth is limited to be less than a melting point of the eutectic metal, approximately, 330° C. or more, it is difficult to obtain suitable ohmic characteristics.

The described problems due to a metal bonding material used in wafer bonding of a vertical structure LED manufacturing process may occur not only in a GaN semiconductor LED manufacturing process but also a vertical structure LED device manufacturing process using other III-V group compound semiconductor such as AlGaInP and AlGaAs semiconductors.

SUMMARY OF THE INVENTION

An aspect of the present invention provides a method of manufacturing a vertical structure light emitting diode device effective capable of performing wafer bonding at a low temperature of 200° C. or less, preventing crystal defects or a crack occurrence, and being effective in improving ohmic characteristics of an electrode contact.

According to an aspect of the present invention, there is provided a method of manufacturing a vertical structure light emitting diode device, the method including: sequentially forming a first conductivity type III-V group compound semiconductor layer, an active layer, and a second conductivity type III-V group compound semiconductor layer on a substrate for growth; bonding a conductive substrate to the second conductivity type III-V group compound semiconductor layer; removing the substrate for growth from the first conductivity type III-V group compound semiconductor layer; and forming an electrode on an exposed portion of the first conductive III-V group compound semiconductor layer due to the removing the substrate for growth, wherein the bonding a conductive substrate includes partially heating a metal bonding layer by applying microwaves to a bonding interface while bringing the metal bonding layer into contact with the bonding interface.

The bonding a conductive substrate may include: forming a first metal bonding layer on the second conductivity type III-V group compound semiconductor layer; forming a second metal bonding layer on the conductive substrate; and partially increasing a temperature of contact surfaces of the metal bonding layers by applying the microwaves to the bonding interface while bringing the first metal bonding layer into contact with the second metal bonding layer.

In the bonding a conductive substrate, a pressure may be applied together with the microwaves to the bonding interface while bringing the metal bonding layer into contact with the bonding interface.

The microwaves may be single mode cavity microwaves of 1 to 10 GHz. The bonding a conductive substrate may be performed at a temperature from a room temperature to 150° C. or less.

In the bonding a conductive substrate, the microwaves may be applied from an outer side of the substrate for growth. When the conductive substrate has a transmittance with respect to the microwaves, the microwaves may be applied from an outer side of the conductive substrate.

The first conductivity type may be n-type, and The second conductivity type may be p-type. The first and second conductivity type III-V group compound semiconductor layers and the active layer may be formed of $Al_xGa_yIn_{(1-x-y)}N$ ($0 \leq x \leq 1$, $0 \leq y \leq 1$, and $0 \leq x+y \leq 1$) semiconductor material. The metal bonding layer may be formed of a metal having a melting point of 350° C. or more. The metal bonding layer may be formed of a metal selected from a group consisting of Au, Al, Ag, Pd, Pt, Rh, Ru, Cu, Mo, and Ni.

On the other hand, the metal bonding layer may be formed of a metal having a relatively low melting point. That is, the metal bonding layer may be formed of a eutectic metal. In this case, the metal bonding layer may be formed of a material with a melting point of 330° C. or less. In detail, the eutectic metal used for the metal bonding layer may include a material selected from a group consisting of Au, Ti, Ni, Pt, Rh, Al, In, and Sn.

The conductive substrate may be one selected from an Si substrate, an Si—Al alloy substrate, an SiC substrate, and a GaAs substrate. The conductive substrate may be a metal substrate including at least one selected from a group consisting of W, Cu, Au, Ni, and Ti. The conductive substrate may have a thermal conductivity of 100 W/mK or more.

The forming an electrode may include: forming a metal layer for an electrode on the first conductivity type III-V group compound semiconductor layer; and thermally processing the metal layer for an electrode at a temperature within a range of 350 to 900° C.

The method may further include forming a reflective metal layer on the second conductivity type III-V group compound semiconductor layer, before the bonding a conductive substrate, the reflective metal layer including a metal selected from a group consisting of Al, Ag, Ni, Ph, Pd, Pt, Ru, Au, and a composition thereof. The method may further include forming a diffusion barrier metal layer on the reflective metal layer, before the bonding a conductive substrate. The diffusion barrier metal layer may include a metal selected from a group consisting of Ti, W, Mo, Co, Pd, Pt, Ni, and a composition thereof. The method may further include forming a diffusion barrier metal layer on a bonding interface side of the conductive substrate, before the bonding a conductive substrate.

According to another aspect of the present invention, there is provided a vertical structure light emitting diode device including: a conductive substrate; a metal bonding layer formed on the conductive substrate and having a melting point of 350° C. or more; a second conductivity type III-V group compound semiconductor layer, an active layer, and a first conductivity type III-V group compound semiconductor layer, sequentially deposited on the metal bonding layer; and an electrode formed on the first conductivity type III-V group compound semiconductor layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
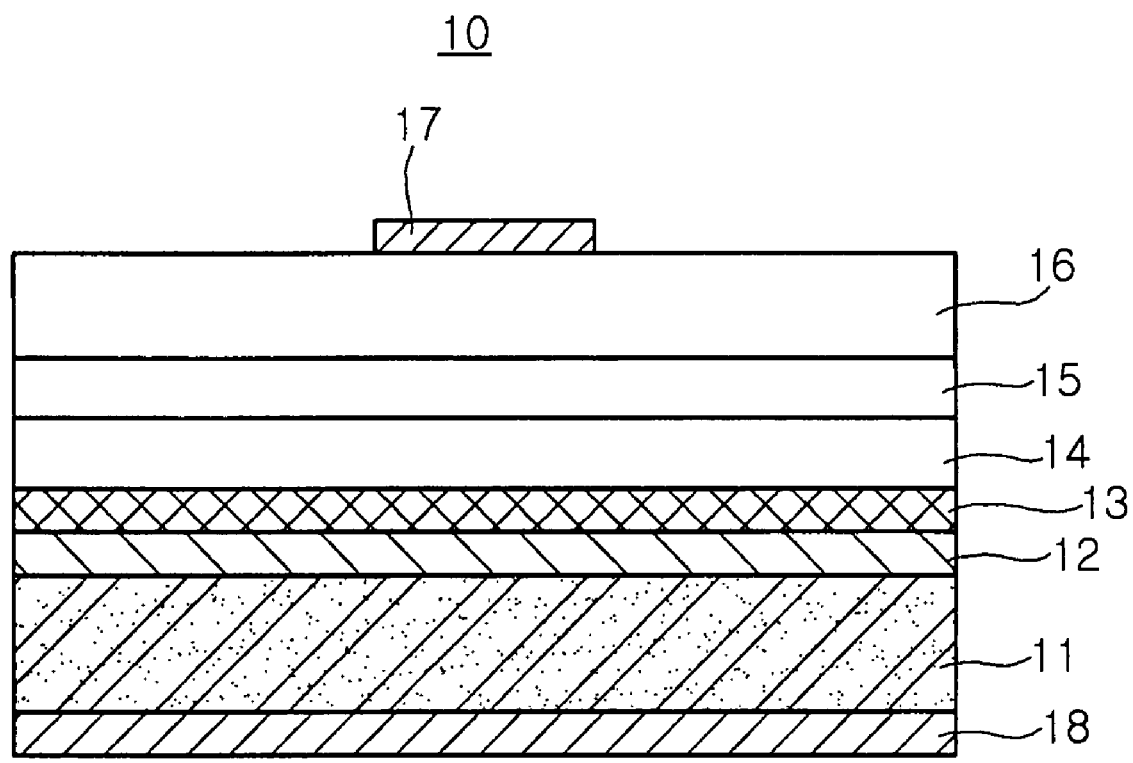
FIG. 1 is a cross-sectional view illustrating a conventional vertical structure light emitting diode (LED) device.
Figure 2A:
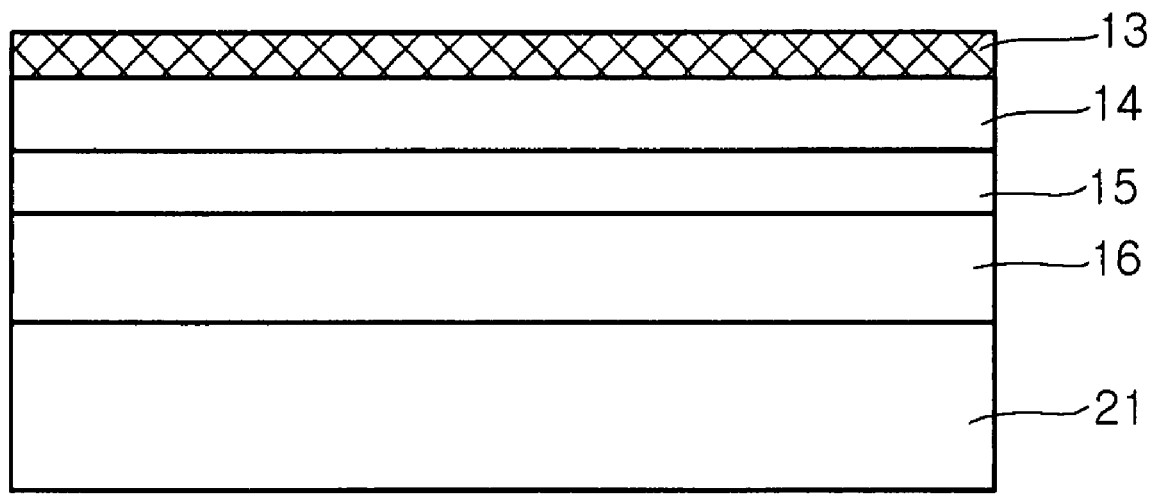
FIGS. 2A through 2D are cross-sectional views illustrating a method of manufacturing a conventional vertical structure LED device.
Figure 2B:
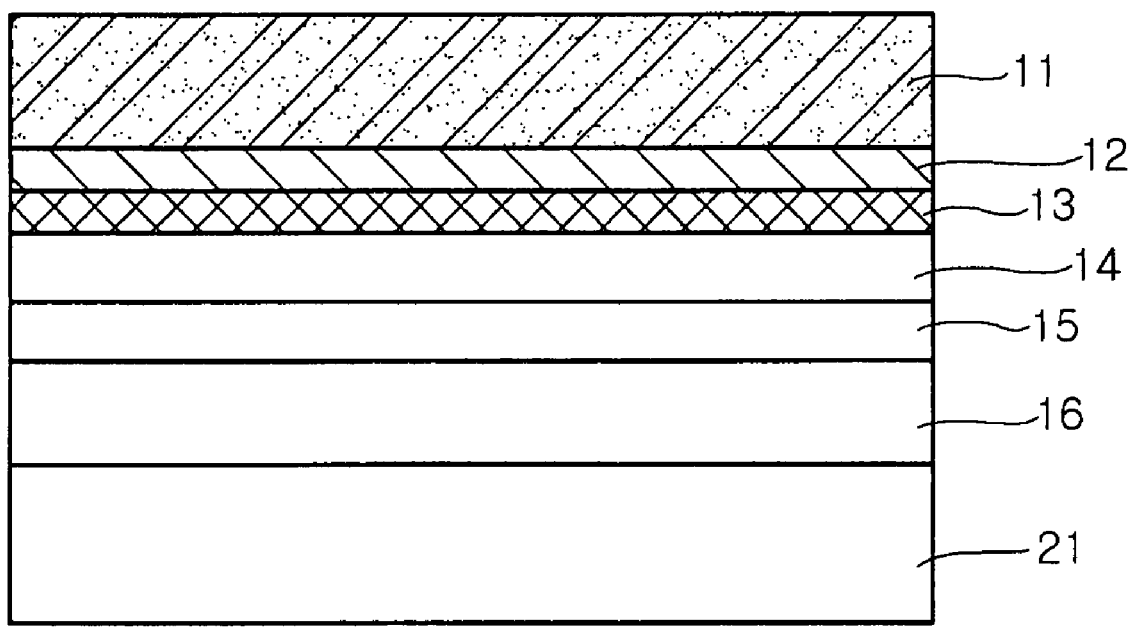
Figure 2C:
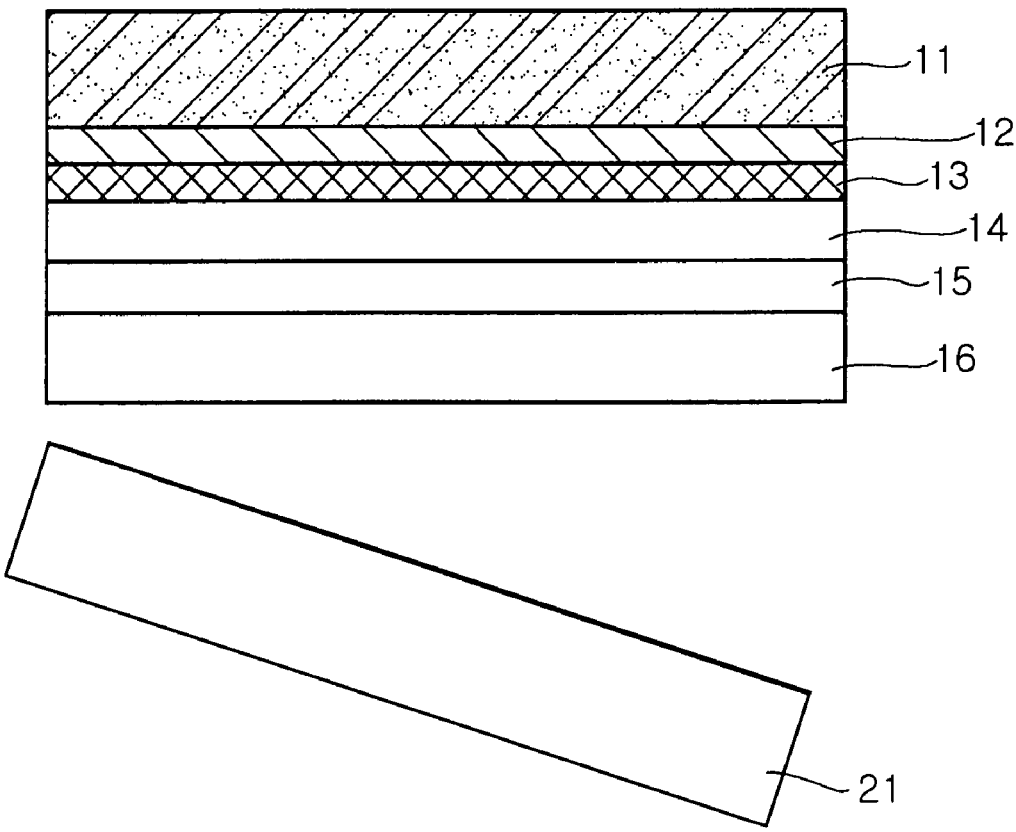
Figure 2D:
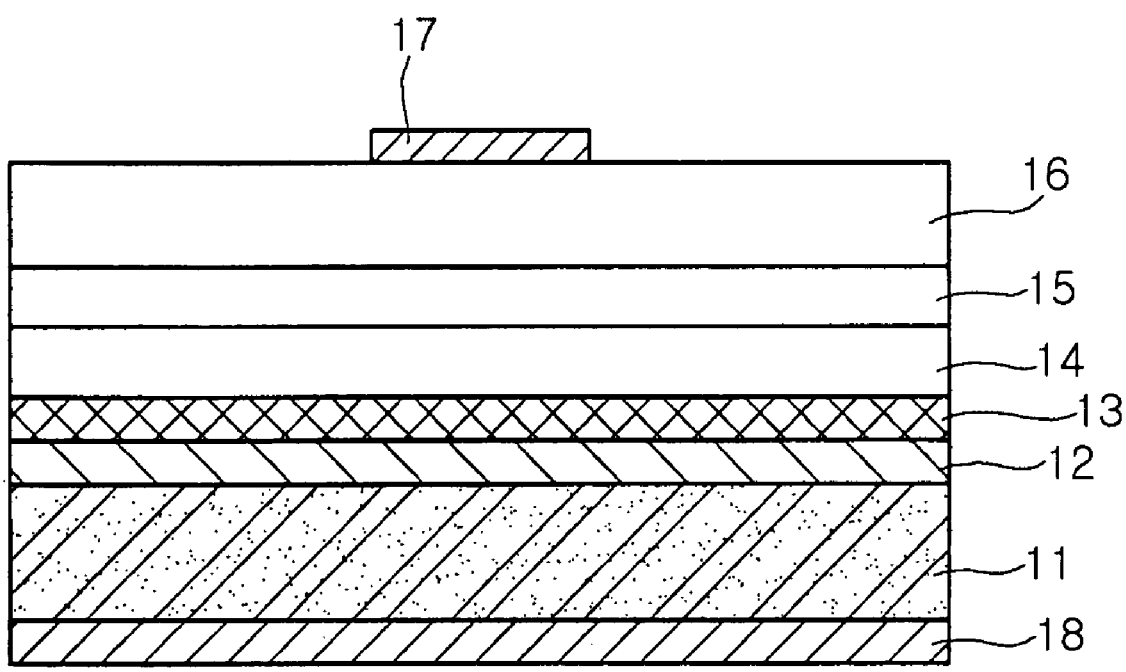

Hereinafter, exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals are used throughout to designate the same or similar components.

Figure 3:
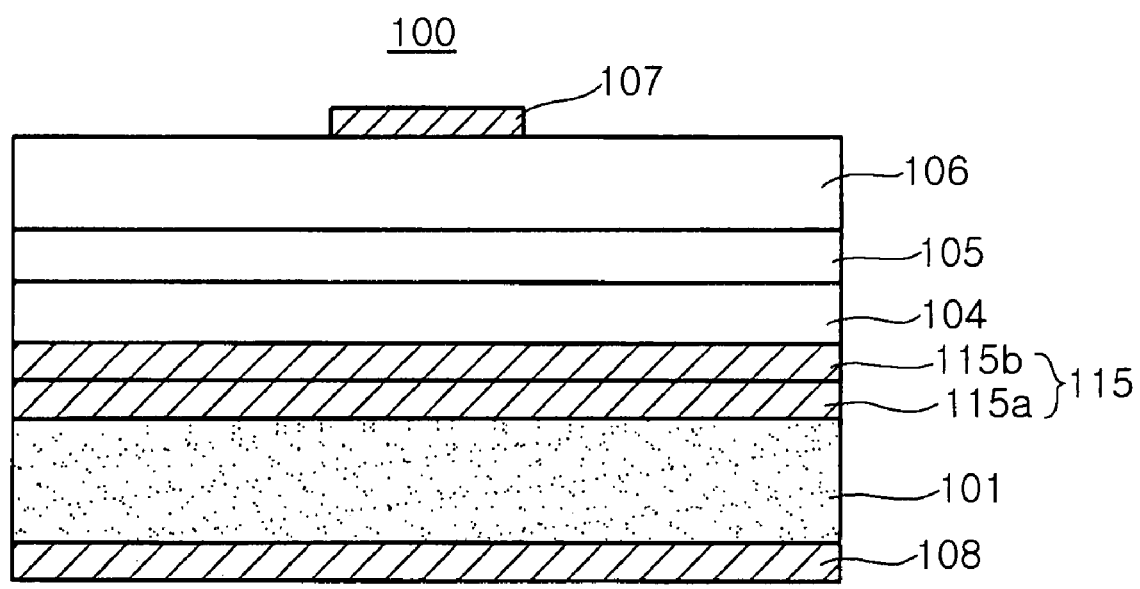
FIG. 3 is a cross-sectional view illustrating a vertical structure LED device according to an embodiment of the present invention.

FIG. 3 is across-sectional view illustrating a vertical structure light emitting diode (LED) device 100 according to an embodiment of the present invention. Referring to FIG. 3, the vertical structure semiconductor LED device 100 includes a conductive substrate 101, a metal bonding layer 115, a p-type semiconductor layer 104, an active layer 105, and an n-type semiconductor layer 106. At the bottom of the conductive substrate 101, a p-side bonding electrode 108 is formed, and an n-side electrode 107 is formed on the n-type semiconductor layer 106. The semiconductor layers 104 to 106 form a light emitting structure and are formed of a III-V group compound semiconductor, and more particular, III group nitride semiconductor $Al_xGa_yIn_{(1-x-y)}N$ ($0 \leq x \leq 1$, $0 \leq y \leq 1$, and $0 \leq x+y \leq 1$).

The conductive substrate 101 has excellent electric and thermal conductivities, and more particularly, have a thermal conductivity of 100 W/mK or more. The high thermal conductivity easily discharge heat generated while an LED operates, thereby increasing reliability and life of a device. Also, the conductive substrate 101 having a high thermal conductivity of 100 W/mK or more has a temperature of itself maintained to be lower when bonding a conductive substrate by using microwaves, as follows.

As the conductive substrate 101 having such the high thermal conductivity, there are an Si—Al alloy substrate and an Si substrate. Particularly, an Si—Al alloy containing 60 to 80 weight percent of Si has a thermal expansion coefficient of about 5 to 9 ppm/K, similar to a thermal expansion coefficient of a sapphire substrate, about 6 to 7 ppm/K. Similarity in those thermal expansion coefficients helps a decrease of a distortion or crack in a substrate, generated in a manufacturing process. In addition, the conductive substrate 101 may be one of an SiC substrate, a GaAs substrate, and a metal substrate such as W, Cu, Au, Ni, and Ti.

The metal bonding layer 115, as follows, is a bonding material used to bond the conductive substrate 101 to the semiconductor layers 104 to 106 and is formed of one of a metal having a high melting point of 350° C. or more and a high melting point metal, such as Au, Al, Ag, Pd, Pt, Rh, Ru, Cu, Mo, and Ni. To prevent a thermal damage of a semiconductor layer while bonding a conductive substrate, it is required that the melting point of the metal bonding layer 115 is lower than that of the semiconductor layers 104 to 106. The metal bonding layer 115 is formed by partially melting and bonding a bonding portion 115a formed on the conductive substrate 101 and a bonding portion 115b formed on the semiconductor layers 104 to 106 by using microwave bonding (refer to FIG. 7).

Only, the metal bonding layer 115 employed in the present embodiment is not limited to the metal with a high melting point. In another embodiment of the present invention, the metal bonding layer 115 may be formed of a eutectic metal. When the metal bonding layer 115 is formed of the eutectic metal as described above, a melting point of the metal boding layer 115 may be lowered to about 330° C. or less. Accordingly, the conductive substrate 101 may be bonded to the semiconductor layers 104 to 106 by using a smaller amount of energy. As the eutectic metal capable of being used for the metal bonding layer 115, anyone of materials with a relatively low melting point such as 330° C. or less is possible, and more particularly, a material including one or more of Au, Ti, Ni, Pt, Rh, Al, In, and Sn such as AuSn, AuIn, PdIn, Sn, and In is possible.

For example, the n-side electrode 107 may be formed of one of Ti/Al and Cr/Au and forms an ohmic contact with the n-type semiconductor layer 106. The n-side electrode 107 is thermally processed at a temperature of 350° C. or more to obtain improved ohmic characteristics. Particularly, though the n-side electrode is thermally processed to obtain satisfactory ohmic characteristics, since the metal bonding layer 115 is formed of a metal having a high melting point such as Au, there is hardly generated a damage due to a thermal process. The p-side bonding electrode 108 may be a contact unit for external wires in die bonding and may be formed of one of Au and an alloy of Au.

The vertical structure LED device 100 has a structure bonded by partially heating the metal bonding layer 115 by using microwave bonding. Accordingly, the vertical structure LED device 100 has a smaller number of defects and cracks than those of a conventional vertical structure LED device manufactured by thermal-pressure bonding. Also, since the metal bonding layer 115 is formed of a metal having a high melting point of 350° C., it is effective to improve ohmic characteristics of the n-side electrode.

Figure 4:
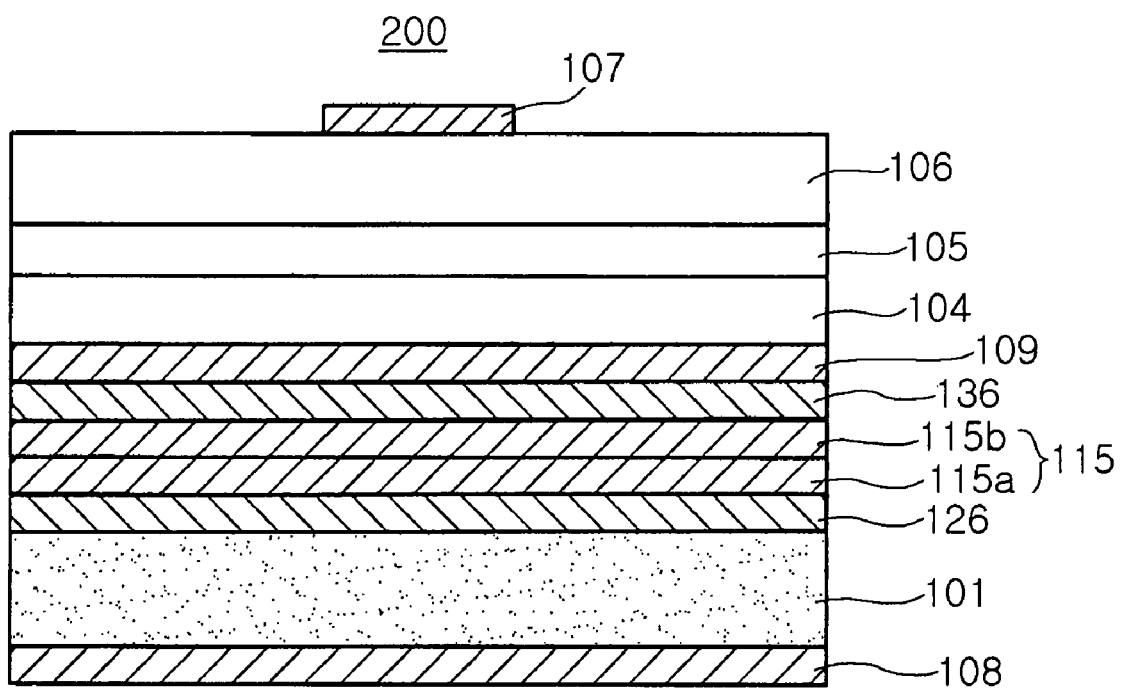
FIG. 4 is a cross-sectional view illustrating a vertical structure LED device according to another embodiment of the present invention.

FIG. 4 is a cross-sectional view illustrating a vertical structure LED device according to another embodiment of the present invention. In the present embodiment, a reflective metal layer 109 having a high reflectivity and a diffusion barrier metal layer 136 are further formed between the p-type semiconductor layer 104 and the metal bonding layer 115. Also, between the conductive substrate 101 and the metal bonding layer 115, another diffusion barrier metal layer 126 is formed.

The reflective metal layer 109 may have a reflectivity of 75% or more and may increase a light emission efficiency of an LED device by reflecting light. Also, the reflective metal layer 109 forms a satisfactory ohmic contact together with the p-type semiconductor layer 104. The reflective metal layer 109 may be formed of one of Al, Ag, Ni, Ph, Pd, Pt, Ru, and a composition thereof.

The diffusion barrier metal layer 136 controls a diffusion interaction between the reflective metal layer 109 and the metal bonding layer 115. Particularly, when the metal bonding layer 115 of Au is diffused throughout one of the reflective metal layer 109 and the p-type semiconductor layer 104, ohmic characteristics of the reflective metal layer 109 may be deteriorated. The diffusion barrier metal layer 136 of one of Pt/Ni, TiW and Ti/TiW allows the deterioration of the ohmic contact to be prevented. The diffusion barrier metal layer 136 may be formed of one of Ti, W, Mo, Co, Pd, Pt, Ni, and a composition thereof.

The diffusion barrier metal layer 126 formed between the conductive substrate 101 and the metal bonding layer 115 controls a diffusion interaction between the conductive substrate 101 formed of a semiconductor such as Si and the metal bonding layer 115. For example, between the conductive substrate 101 of Si and the metal bonding layer 115 of Au, the diffusion barrier metal layer 126 of one of Mo, W, Cr, TiW, and TiN is installed, thereby preventing diffusion between Au and Si and controlling one of ohmic contact deterioration and a melting point drop of an Au metal bonding layer. The described diffusion barrier metal layers 126 and 136 are selective elements and may be omitted when there is no problem in a diffusion interaction with the metal bonding layer 115.

FIGS. 5 through 10 are cross-sectional views illustrating a method of manufacturing a vertical structure LED device according to an embodiment of the present invention.

Figure 5:
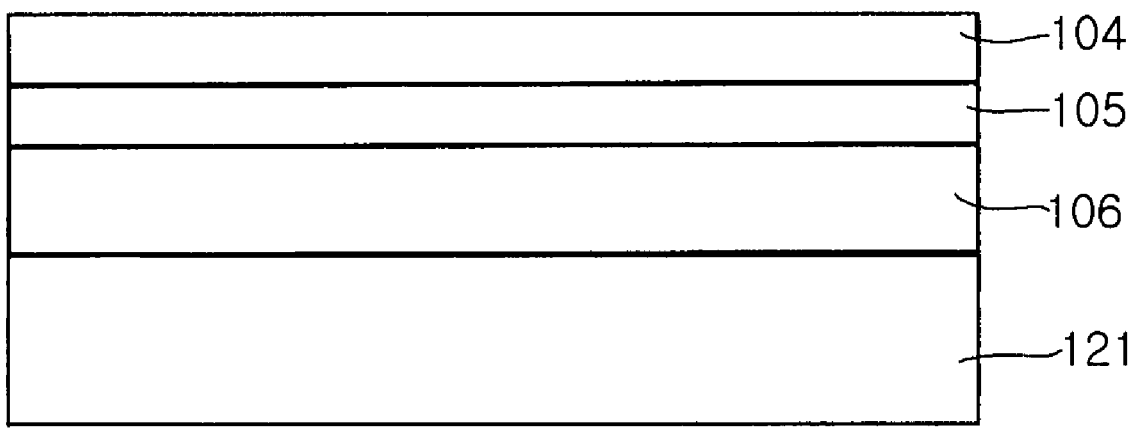
FIGS. 5 through 10 are cross-sectional views illustrating a method of manufacturing a vertical structure LED device according to an embodiment of the present invention.

Referring to FIG. 5, for example, by using one of MOCVD and MBE processes, the n-type semiconductor layer 106, the active layer 105, and the p-type semiconductor layer 104 are sequentially grown above a sapphire substrate 121 for growth. The semiconductor layers 104 to 106 are III group nitride semiconductors and form a light emitting structure of.

Figure 6A:
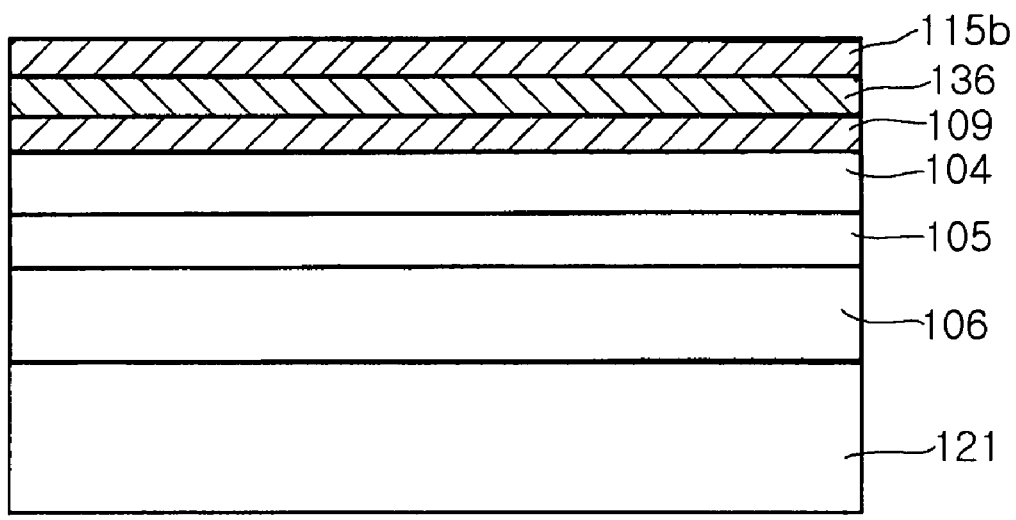

As shown in FIG. 6A, the reflective metal layer 109, the diffusion barrier metal layer 136, and a first metal bonding layer are sequentially formed above the grown semiconductor layers 104 to 106. The first metal bonding layer 115b may be formed of a metal having a high melting point of 350° C. or more. For example, the reflective metal layer 109 may be formed of Ag, the barrier metal layer 136 may be formed of TiW, and the first metal bonding layer 115b may be formed of Au. When necessary, reflective metal layer 109 and/or the diffusion barrier metal layer 136 may be omitted (refer to FIG. 3).

Figure 6B:
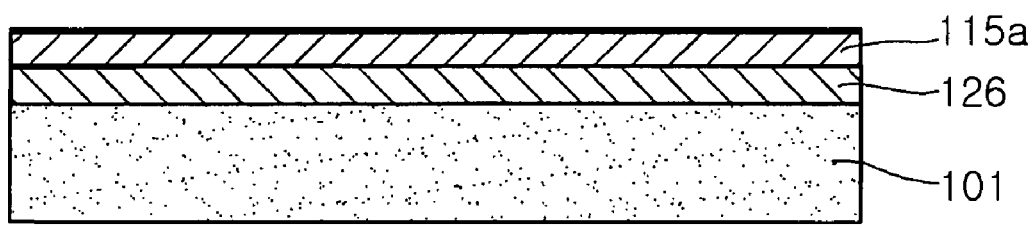

On the other hand, as shown in FIG. 6B, the conductive substrate 101 is prepared and the diffusion barrier metal layer 126 and a second metal bonding layer are sequentially formed above the conductive substrate 101. For example, above the conductive substrate 101 of one of an Si substrate and an Si—Al alloy substrate, the diffusion barrier metal layer 126 of TiW and the second metal bonding layer 115a of Au may be formed. When necessary, the diffusion barrier metal layer may be omitted (refer to FIG. 3). A process of forming the second metal bonding layer 115a, shown in FIG. 6B, may be performed prior to, after, or simultaneously with a process of forming the first metal bonding layer 115b, shown in FIG. 6A.

Only, as described above, according to embodiments, as the first and second metal bonding layers 115a and 115b, a eutectic metal such as AuSn, AuIn, PdIn, Sn, and In may be used, instead of the metal with a high melting point.

The conductive substrate 101 has a thermal conductivity of 100 W/mK or more. As described above, having the high thermal conductivity of 100 W/mK, heat generated in a bonding interface of a later conductive substrate bonding process may be more quickly emitted. Also, due to the high thermal conductivity, heat accumulated while the device operates is quickly emitted to the outside, thereby maintaining temperatures of the substrates 101 and 121 of themselves to be lower and reducing occurrences of cracks and defects in the conductive substrate bonding process.

Figure 7:
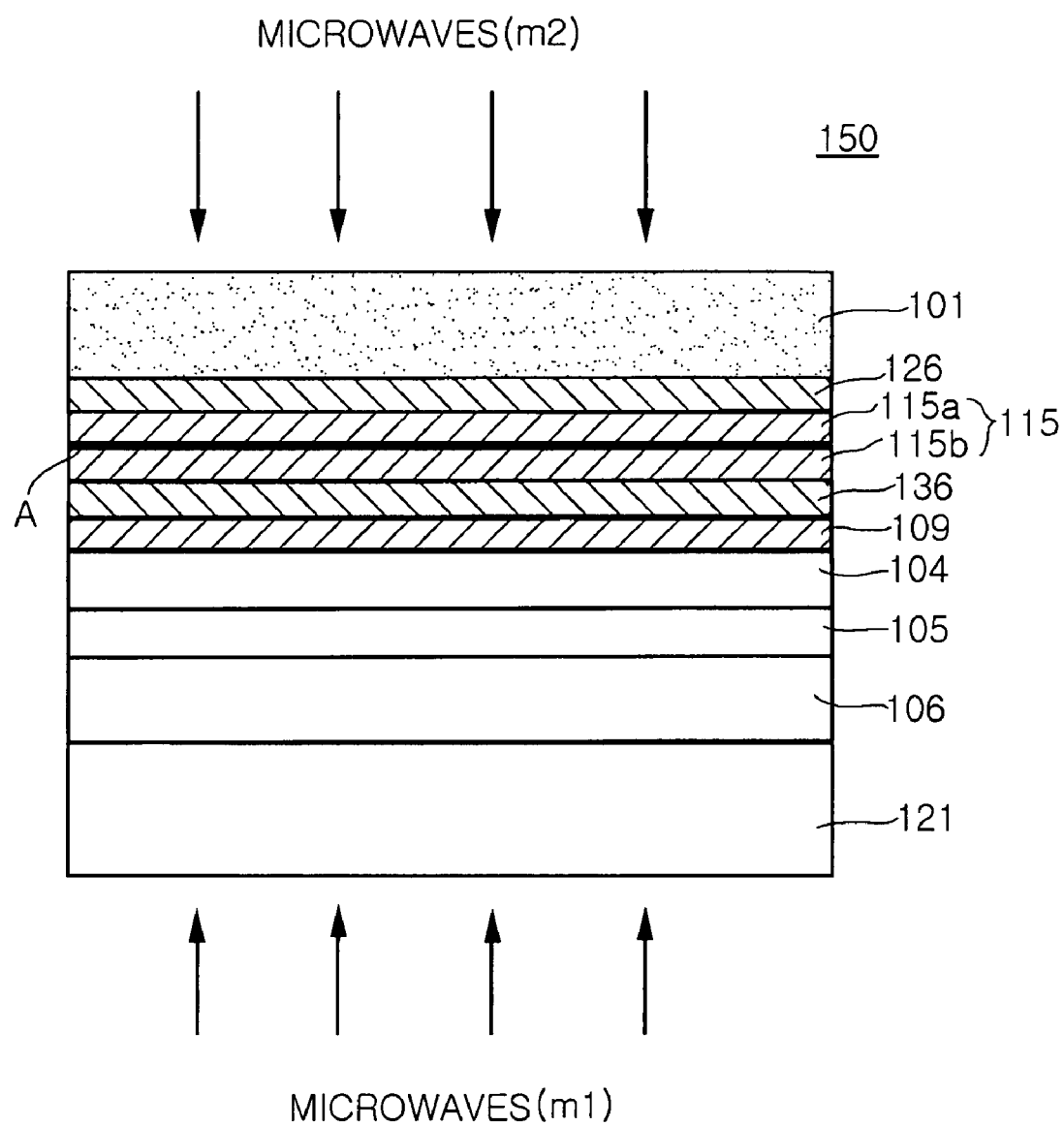

Referring to FIG. 7, when the metal bonding layers 115a and 115b are brought into contact with a bonding interface A, a process of bonding the conductive substrate 101 is performed by applying microwaves to the bonding interface A. When using the microwave bonding process, it is possible to partially heat only the metal bonding layer 115. Temperatures of contact surfaces of the metal bonding layers 115a and 115b are increased to 350° C. or more, thereby melting and bonding the metal bonding layers 115a and 115b at the contact surfaces.

Only, similar to another embodiment of the present invention, when the eutectic metal is employed as the metal boding layers 115a and 115b, the metal bonding layers 115a and 115b may be melted and bonded while a temperature of a contact surface is 330° C. or less.

The microwaves applied to the bonding interface A may be single mode cavity microwaves of 1 to 10 GHz. For example, the process of bonding the conductive substrate 101 by using microwave bonding may be performed by applying single mode cavity microwaves having a frequency of 2 to 2.5 GHz and a wavelength of 10 to 30 cm at a room temperature of about 24° C.

The bonding by applying microwaves is caused by an interaction of high frequency energy in a metal contact surface of a thin film. In the single mode cavity, power transferred to a metal contact portion by applying microwaves is in proportion to an electric conductivity and electric field $E^2$, as shown in the following Equation 1.

$$P = \tfrac{1}{2}\omega_o \in_o \in' (\tan \delta) E^2 \qquad \text{Equation (1)}$$

where $\omega_o$ is a basic frequency of microwaves, $\in_o$ is a permittivity of a free space, $\in'$ is an imaginary dielectric constant, $\tan \delta$ is a loss tangent.

The power accumulated in the metal bonding layer 115 heats a contact portion, thereby increasing a temperature the contact portion to be capable of melting a high melting point metal such as Au. Via the partial heating by using microwave bonding, the metal bonding layers 115a and 115b are easily melted and bonded.

In the process of bonding the conductive substrate 101 by using microwave bonding, only the bonding interface A is partially heated. Accordingly, there is no need to heat the entire substrate and the bonding process may be performed at a temperature from a room temperature to 150° C. or less. Except a near area of the bonding interface A, temperatures of areas of the conductive substrate 101, the semiconductor layers 104 to 106, and the sapphire substrate 121 are maintained to be 200° C. or less.

Accordingly, occurrences of distortions, defects, and cracks in the substrate are notably decreased and a yield of a later process of removing the sapphire substrate 121 is greatly improved by a reduction of stress and strain due to a thermal expansion coefficient difference between the substrates 101 and 121. In addition, the described conductive substrate bonding process by using microwave bonding (wafer bonding process) is performed within 120 seconds, thereby notably reducing a process time. Also, since a process temperature that is an atmosphere temperature of the wafer bonding process is very low, a material having a great thermal expansion coefficient with respect to the sapphire substrate 121 may be used as the conductive substrate 101 to be wafer-bonded without "actual strain", thereby expanding a range of a material for a conductive substrate.

To transfer power to the metal bonding layer 115, the applied microwaves should not be absorbed into other materials, for example, the conductive substrate 101 disposed in a path of the microwaves. Generally, since dielectric materials and semiconductors has a transmittance with respect to microwaves, microwaves m1 applied from the outside of the sapphire substrate 121 may pass through the sapphire substrate 121 and transfer power to the near area of the bonding interface A. Also, microwaves m2 progressing from the outside of the conductive substrate 101 of Si toward the bonding interface A may pass through the conductive substrate of Si and transfer power to the near area of the contact portion of the metal bonding layer 115a and 115b. However, when the conductive substrate 101 is formed of a metal, since the conductive substrate absorbs microwaves, the microwaves should be applied from the outside of the sapphire substrate 121.

Figure 8:
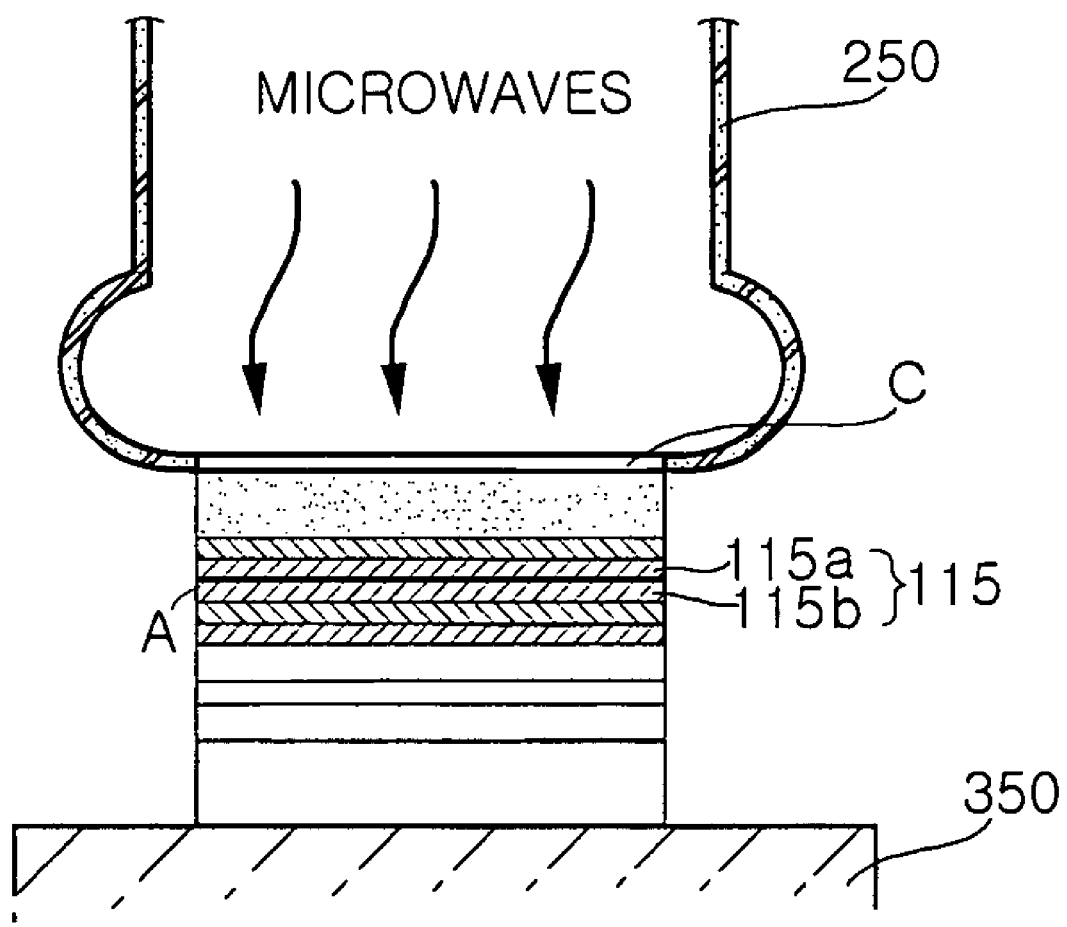

FIG. 8 is a schematic diagram illustrating an example of a microwave bonding process capable of being employed in the present embodiment. As shown in FIG. 8, a bonding material 150 as shown in FIG. 7 is mounted on a suitable supporter 350, and microwaves are applied from a top of the bonding material 150 to a bonding interface A of the metal bonding layers 115a and 115b. In this case, simultaneously with applying the microwaves, a pressure may be applied by using a chuck 250. As shown in FIG. 7, the microwaves are applied from the inside of the chuck 250 to the bonding interface A via a window C, and the pressure may be applied by the chuck 250 at the same time. However, without a pressure applied from the outside, microwave bonding may be performed in a state of a contact due to own weight.

Figure 9:
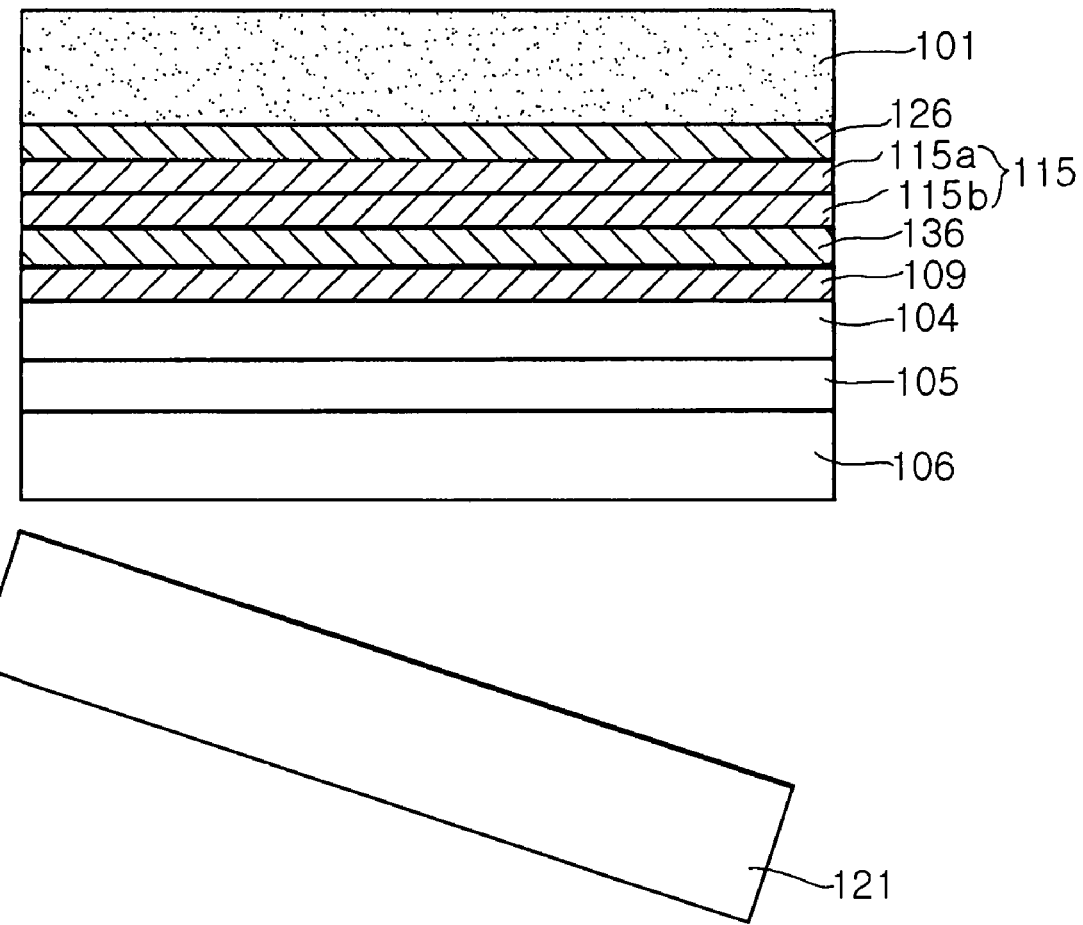

Next, as shown in FIG. 9, a KrF laser is irradiated to an interface of the sapphire substrate 121 and the semiconductor layer 106 by laser lift off, thereby separating the sapphire substrate 121. The sapphire substrate 121 may be removed by using a CMP process instead of the laser lift off.

Figure 10:
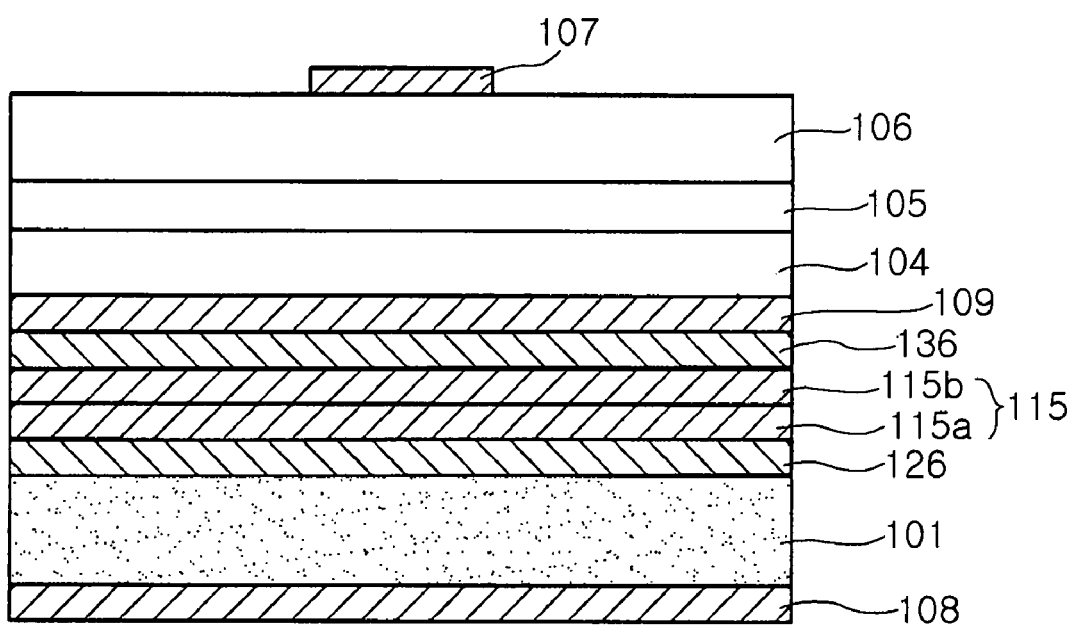

As shown in FIG. 10, the n-side electrode 107 and the p-side bonding electrode 108 are formed on a portion of the n-type semiconductor layer 106, exposed due to the separation of the sapphire substrate 121, and an opposite side of the conductive substrate 101, respectively.

To appropriately increase ohmic characteristics of the n-side electrode 107, a metal layer for the n-side electrode 107 is formed on the exposed portion of the n-type semiconductor layer 106 and is thermally processed at a temperature from 350 to 900° C. Though the thermal processing is performed, since the metal bonding layer 115 is formed of a high melting point metal such as Au, there is hardly a damage of the metal bonding layer 115 or a damage of the entire structure due to the thermal processing. Therefore, a high reliability vertical structure LED device having improved ohmic characteristics is easily manufactured.

Though the semiconductor layers 104 to 106 are III group nitrides in the described embodiments, the present invention is not limited thereto. For example, the present invention may be applied to a vertical structure LED device based on one of $Al_xGa_yIn_{(1-x-y)}N$ ($0 \leq x \leq 1$, $0 \leq y \leq 1$, and $0 \leq x+y \leq 1$) and $Al_xGa_{1-x}As$ ($0 \leq x \leq 1$) and a method of manufacturing the same.

As described above, according to the present invention, a bonding interface is partially heated by microwave bonding, thereby performing a wafer bonding process at a temperature from a room temperature to 150° C. or less and using a high melting point metal having a melting point of 350° C. or more or a eutectic metal as a bonding material. Accordingly, a strain of the bonded wafer and cracks and defects generated thereby are notably reduced and an occurrence of a distortion of the wafer is controlled. Also, a process yield of a process of removing a substrate for growth after the wafer bonding process is greatly improved. In addition, a time for the wafer bonding process may be greatly shortened, and a conductive substrate formed of a material having a great thermal expansion coefficient is also used for the wafer bonding.

By using a metal bonding layer having a high melting point of 350° C. or more, a temperature for thermally processing a contact material may be appropriately increased when forming an n-side electrode after separating the substrate for growth. Therefore, ohmic characteristics of the n-side electrode are more improved, and reliability of an LED device is increased.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a vertical structure light emitting diode device, the method comprising:
   sequentially forming a first conductivity type III-V group compound semiconductor layer, an active layer, and a second conductivity type III-V group compound semiconductor layer on a substrate for growth;
   forming a reflective metal layer on the second conductivity type III-V group compound semiconductor layer,
   forming a diffusion barrier metal layer on the reflective metal layer,
   forming a first metal bonding layer on the diffusion barrier metal layer,
   preparing a conductive substrate having a second metal bonding layer thereon,
   bonding the first metal bonding layer and the second metal bonding layer,
   removing the substrate for growth from the first conductivity type III-V group compound semiconductor layer; and
   forming an electrode on an exposed portion of the first conductive III-V group compound semiconductor layer due to the removing the substrate for growth,
   wherein the bonding of the first metal bonding layer and the second metal bonding layer, comprises:
   partially heating a metal bonding layer by applying microwaves to a bonding interface, and applying a pressure together with the microwaves to the bonding interface while bringing the metal bonding layers into contact with the bonding interface.

2. The method of claim 1, wherein the bonding the conductive substrate comprises:
   partially increasing a temperature of contact surfaces of the metal bonding layers by applying the microwaves to the bonding interface while bringing the first metal bonding layer into contact with the second metal bonding layer.

3. The method of claim 1, wherein the microwaves are single mode cavity microwaves of 1 to 10 GHz.

4. The method of claim 1, wherein the bonding the conductive substrate is performed at a temperature from a room temperature to 150° C. or less.

5. The method of claim 1, wherein, in the bonding the conductive substrate, the microwaves are applied from an outer side of the substrate for growth.

6. The method of claim 1, wherein, when the conductive substrate has a transmittance with respect to the microwaves, the microwaves are applied from an outer side of the conductive substrate.

7. The method of claim 1, wherein the conductive substrate is one selected from an Si substrate, an Si—Al alloy substrate, an SiC substrate, and a GaAs substrate.

8. The method of claim 1, wherein the conductive substrate is a metal substrate comprising at least one selected from a group consisting of W, Cu, Au, Ni, and Ti.

9. The method of claim 1, wherein the conductive substrate has a thermal conductivity of 100 W/mK or more.

10. The method of claim 1, wherein the first conductivity type is n-type, and the second conductivity type is p-type.

11. The method of claim 1, wherein the first and second conductivity type III-V group compound semiconductor layers and the active layer are formed of $Al_xGa_yIn_{(1-x-y)}N$ ($0 \leq x \leq 1$, $0 \leq y \leq 1$, and $0 \leq x+y \leq 1$) semiconductor material.

12. The method of claim 1, wherein the metal bonding layer is formed of a metal having a melting point of 350° C. or more.

13. The method of claim 12, wherein the metal bonding layer is formed of a metal selected from a group consisting of Au, Al, Ag, Pd, Pt, Rh, Ru, Cu, Mo, and Ni.

14. The method of claim 1, wherein the metal bonding layer is formed of a eutectic metal.

15. The method of claim 14, wherein the metal bonding layer is formed of a material with a melting point of 330° C. or less.

16. The method of claim 14, wherein the metal bonding layer comprises a material selected from a group consisting of Au, Ti, Ni, Pt, Rh, Al, In, and Sn.

17. The method of claim 1, wherein the forming an electrode comprises:
   forming a metal layer for an electrode on the first conductivity type III-V group compound semiconductor layer; and
   thermally processing the metal layer for an electrode at a temperature within a range of 350 to 900° C.

18. The method of claim 1, wherein the reflective metal layer comprises a metal selected from a group consisting of Al, Ag, Ni, Ph, Pd, Pt, Ru, Au, and a composition thereof.

19. The method of claim 1, wherein the diffusion barrier metal layer comprises a metal selected from a group consisting of Ti, W, Mo, Co, Pd, Pt, Ni, and a composition thereof.

20. The method of claim 1, wherein the conductive substrate comprises an additional diffusion barrier metal layer on which the second metal bonding layer is formed.

* * * * *